(12) United States Patent
De Mol et al.

(10) Patent No.: US 7,889,318 B2
(45) Date of Patent: *Feb. 15, 2011

(54) METHODS OF CHARACTERIZING SIMILARITY BETWEEN MEASUREMENTS ON ENTITIES, COMPUTER PROGRAMS PRODUCT AND DATA CARRIER

(75) Inventors: Christianus Gerardus Maria De Mol, Son en Breugel (NL); Maria Elisabeth Reuhman-Huisken, Waalre (NL)

(73) Assignee: ASML Netherlands B.V., Veldhoven (NL)

(*) Notice: Subject to any disclaimer, the term of this patent is extended or adjusted under 35 U.S.C. 154(b) by 210 days.

This patent is subject to a terminal disclaimer.

(21) Appl. No.: 12/233,484

(22) Filed: Sep. 18, 2008

(65) Prior Publication Data

US 2009/0076999 A1 Mar. 19, 2009

Related U.S. Application Data

(63) Continuation-in-part of application No. 11/902,186, filed on Sep. 19, 2007.

(51) Int. Cl.
G03B 27/53 (2006.01)
G03B 27/32 (2006.01)

(52) U.S. Cl. .......................... 355/53; 355/77; 702/150

(58) Field of Classification Search ................. 355/30, 355/53, 72, 77; 430/30; 356/237.4, 237.5; 706/52; 702/150
See application file for complete search history.

(56) References Cited

U.S. PATENT DOCUMENTS 5,191,200 A 3/1993 van der Werf et al.

| | | | |
|---|---|---|---|
| 6,521,385 B2 * | 2/2003 | Yoshida et al. | 430/22 |
| 2003/0170552 A1 * | 9/2003 | Miyashita et al. | 430/30 |
| 2006/0279720 A1 * | 12/2006 | Sekigawa et al. | 355/69 |
| 2008/0106714 A1 * | 5/2008 | Okita | 355/53 |
| 2009/0073403 A1 * | 3/2009 | De Mol et al. | 355/53 |

OTHER PUBLICATIONS

De Mol et al., "Methods of Characterizing Similarity or Consistency in a Set of Entities", U.S. App. No. 11/902,186 filed Sep. 19, 2007.

* cited by examiner

*Primary Examiner*—Alan A Mathews
(74) *Attorney, Agent, or Firm*—Sterne, Kessler, Goldstein & Fox, P.L.L.C.

(57) ABSTRACT

A method for characterizing the similarity between measurements on a plurality of entities comprising a first entity and a second entity comprises receiving measurements taken at a plurality of measurement points per entity. A model is defined comprising a stochastic process and a model function having values which depend on a set of parameters and the measurement points. A set ($\beta$) of parameters is estimated by fitting the model function to the measurements. Residual data is determined for at least a part of the plurality of measurement points for the first entity and the second entity by subtracting the fitted function from the measurements. A correlation coefficient for the first entity (i') and the second entity (i") is estimated based on the determined residual data and the estimated correlation coefficient is used to characterize the similarity between the measurements. The model is defined such that the residual data is expected to have a deterministic component which depends on the measurement points and that dominates the estimate of the correlation coefficient. The correlation coefficient is estimated using an estimate for the entity average residue averaged over the measurement points of the first entity and using an estimate for the entity average residue averaged over the measurement points of the second entity.

23 Claims, 3 Drawing Sheets

METHODS OF CHARACTERIZING SIMILARITY BETWEEN MEASUREMENTS ON ENTITIES, COMPUTER PROGRAMS PRODUCT AND DATA CARRIER

CROSS REFERENCE TO RELATED APPLICATIONS

This application is a continuation-in-part of U.S. application Ser. No. 11/902,186, filed Sep. 19, 2007, which is incorporated by reference herein in its entirety.

BACKGROUND

1. Field of Invention

The present invention relates to a method of characterizing the similarity between measurements on entities. The invention also relates to a computer program product and a data carrier comprising such computer program product.

2. Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Manufacturing a typical device by a lithographic process typically includes a plurality of cycles of various types of steps. These steps may include coating the substrate with a photosensitive material (or otherwise applying a photosensitive material to one or more surfaces of the substrate), projecting an image on the photosensitive material, developing the photosensitive material and processing the substrate, which can include covering the substrate in a new layer of material. One of the problems that may be encountered with the lithographic process is that successive layers are not accurately imaged on top of each other so that there is a so-called overlay error. In order to avoid proceeding onto the subsequent steps when an overlay error already exists which would be detrimental to the component's performance, after each cycle the overlay error may be measured. If the overlay error is too large then the most recent layer can be removed and that step repeated before proceeding onto the next step.

In order to reduce overlay error, substrates are generally provided with a plurality of reference marks so that the position of the substrate on a substrate table in a projection apparatus may be measured very precisely prior to the exposure operation. In this way it is possible to improve the accuracy of the exposure operation because the relative positions of the substrate, the previously applied patterned layer and the patterning device in the lithographic apparatus may be determined.

Another problem with multi-cycle lithographic processes is the deformation of the substrate which can occur with the application of particular layers and/or particular patterns. Deformation includes, for example, topographic 3-dimensional deformation, deformation of the reference marks (shape or depth) or variation of layer properties or thicknesses deposited on the substrate. Chemical mechanical polishing (CMP) is notorious for causing deformation of the substrate. With the use of substrates with a diameter of 300 mm or more, it is expected that substrate deformation may become an even more important factor. In order to reduce deformation, it may be desirable to keep the processes as uniform as possible over the whole area of the substrate. Deformation of the substrate may lead to errors in the imaging of the substrate resulting in the need to repeat a particular operation. Also, during the development of a process for a particular component manufactured by lithography, the process may be optimized to minimize, or at least keep within limits, the amount of substrate deformation. The reduction of overlay error or an error as a result of substrate deformation, or at least early detection of one or more of such errors, may lead to improved yield.

Small particles present on the surface of the substrate may hamper the lithographic process since at the positions of the particles no proper illumination of the substrate can be achieved. Generally the size of the particles is such that they cannot be detected by the level sensors present in the lithographic apparatus, but they may be detected when more accurate level sensors are employed, for instance in dedicated measurement equipment of the manufacturer of the substrate.

Small particles may also be present between the substrate carrier, i.e. the support table or chuck, and the substrate. These particles may deform the layers before the lithographic process is performed.

The particles cause artifacts, so-called focus spots, in the subsequent layers arranged at the surface of the substrate. When the artifacts are positioned beneath an alignment mark, they may give rise to overlay errors as well. A timely detection of the artifacts, i.e. a detection before the next layer is applied on the substrate, may lead to an improved yield.

One option would be to measure the substrate at least parts of the grids and/or substrate shapes of a number of substrates in separate (off-line) measuring instruments (metrology tools) or on-line in the lithographic apparatus itself, just before a pattern is to be applied on the substrate, and show the results of the measurements in graphical representations. Such a graphical representation typically comprises a huge amount of data. Therefore, the graphical representations practically can not be analyzed and interpreted by a human operator. The interpretation based on graphical representations of the measured substrate grid and shape is rather subjective and time-consuming and does not provide a workable situation for defining substrate-shape, substrate-grid and substrate field-shape consistency given the huge amount of measurement data. This hampers process characterization, criteria for transfer to production, and production quality monitoring.

SUMMARY

It is desirable to provide a method for efficiently characterizing the similarity between measurements of a plurality of entities.

According to an aspect of the invention, there is provided a method for characterizing the similarity between measurements on a plurality of entities (i) comprising a first entity (i') and a second entity (i"), the method comprising:

receiving measurements (wi,j) taken at a plurality of measurement points (j) per entity (i);

defining a model comprising a stochastic process and a model function (h), the model function (h) having values which depend on a set of parameters (β) and the measurement points (j);

estimating the set of parameters (β) by fitting the model function to the measurements (wi,j);

determining residual data (Zi,j) at the plurality of measurement points (j) for the first entity (i') and the second entity (i") by subtracting the fitted model function from the measurements;

estimating a correlation coefficient (ri',i") for the first entity (i') and the second entity (i") based on the determined residual data (Zi,j);

using the estimated correlation coefficient (ri',i") to characterize the similarity between the measurements;

characterized by defining the model such that the residual data is expected to have a deterministic component which depends on the measurement points and that dominates the estimate of the correlation coefficient and estimating the correlation coefficient (ri',i") using an estimate for the entity average residue averaged over the measurement points of the first entity (i') and using an estimate for the entity average residue averaged over the measurement points of the second entity (i").

According to another aspect of the invention, there is provided a computer program product comprising instructions and data stored on a computer useable medium and which when executed by a computer processor, causes the computer to characterize the similarity between measurements of a plurality of entities (i) comprising a first entity (i') and a second entity (i"), by a process comprising:

receiving measurements (wi,j) taken at a plurality of measurement points (j) per entity (i);

defining a model comprising a stochastic process and a model function (h), the model function (h) having values which depend on a set of parameters (β) and the measurement points (j);

estimating the set of parameters (β) by fitting the model function to the measurements (wi,j);

determining residual data (Zi,j) at the plurality of measurement points (j) for the first entity (i') and the second entity (i") by subtracting the fitted model function from the measurements;

estimating a correlation coefficient (ri',i") for the first entity (i') and the second entity (i") based on the determined residual data (Zi,j);

using the estimated correlation coefficient (ri',i") to characterize the similarity between the measurements;

wherein the model is defined such that the residual data is expected to have a deterministic component which depends on the measurement points and that dominates the estimate of the correlation coefficient and estimating the correlation coefficient (ri',i") using an estimate for the entity average residue averaged over the measurement points of the first entity (i') and using an estimate for the entity average residue averaged over the measurement points of the second entity (i").

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
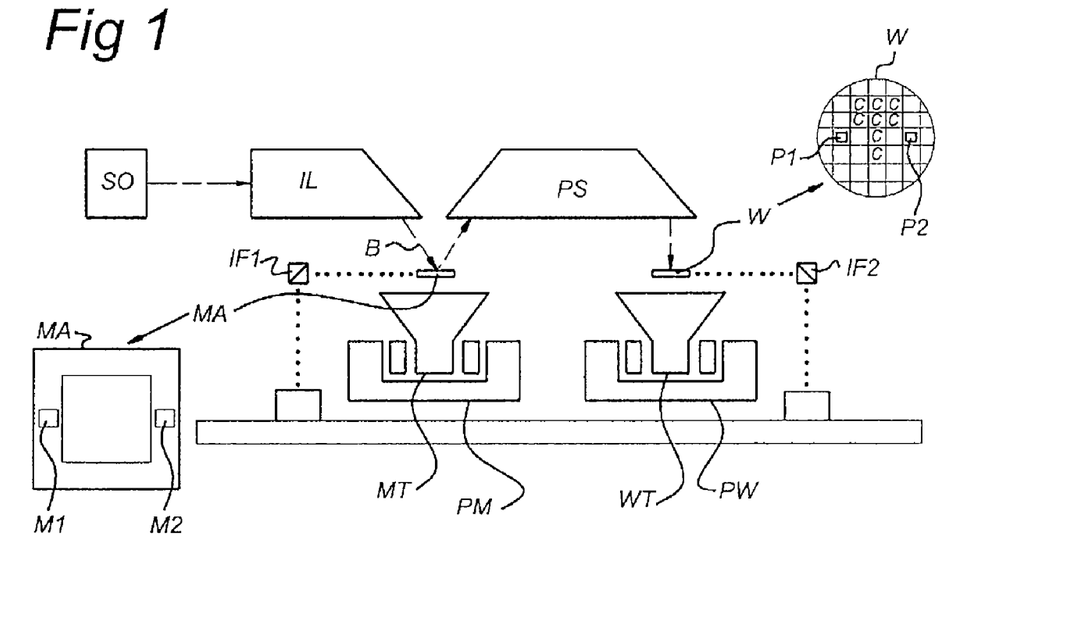
FIG. 1 depicts schematically a lithographic apparatus according to an embodiment of the invention.

In an embodiment of the invention a lithographic apparatus is used to measure a substrate. FIG. 1 depicts schematically a lithographic apparatus according to an embodiment of the invention. The apparatus includes:

an illumination system (illuminator) IL configured to condition a radiation beam B (e.g., UV radiation or EUV radiation).

a support structure (e.g., a mask table) MT constructed to support a patterning device (e.g., a mask) MA and connected to a first positioner PM configured to accurately position the patterning device in accordance with certain parameters;

a substrate table (e.g., a wafer table) WT constructed to hold a substrate (e.g., a resist-coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g., employing a reflective mask). Alternatively, the apparatus may be of a transmissive type (e.g., employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

The illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g., an interferometric device, linear encoder or capacitive sensor), the substrate table WT can be moved accurately, e.g., so as to position different target portions C in the path of the radiation beam B. Similarly, the first positioner PM and another position sensor IF1 can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

In a typical dual stage lithographic projection apparatus the number of substrate reference marks or alignment marks might be about 25 per substrate W. For reasons of clarity a smaller number of marks is shown in FIG. 1.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
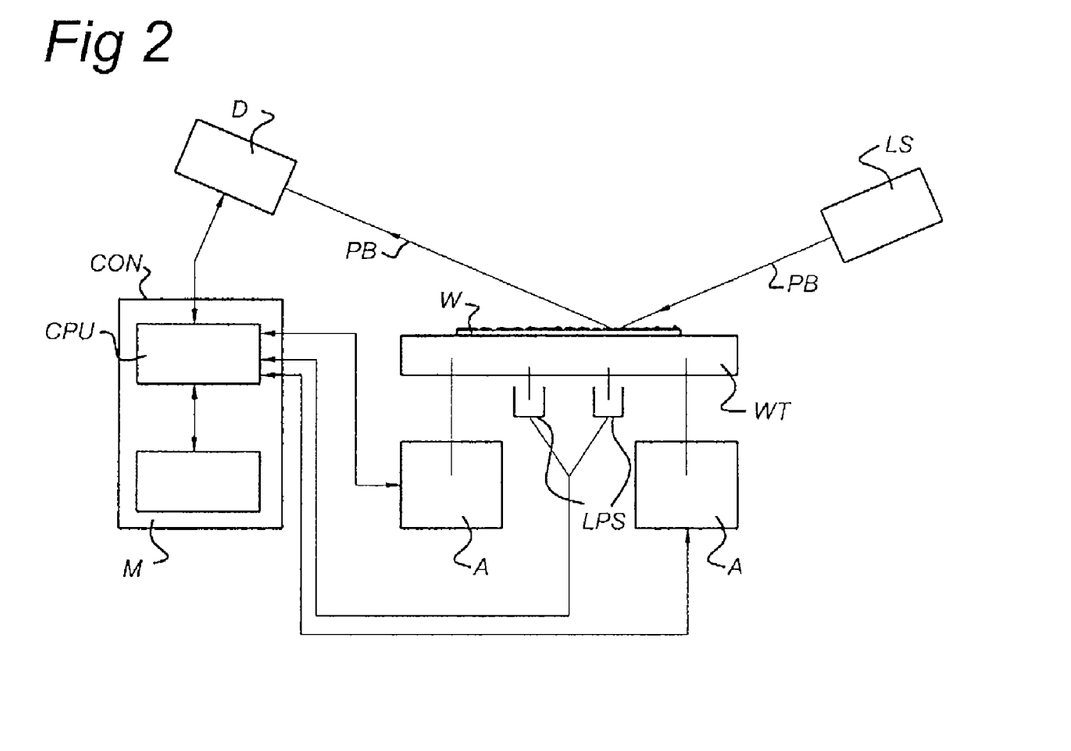
FIG. 2 depicts schematically the measurement station region of the lithographic apparatus of FIG. 1.

FIG. 2 depicts schematically the measurement station region of the lithographic apparatus of FIG. 1. The position sensor IF2 shown in FIG. 1 measures at a number of measurement points, for instance at the alignment marks (P1,P2) shown in FIG. 1, the lateral positions (x,y-coordinates) and the height positions (z-coordinate) of the substrate W placed on the substrate table WT. The substrate table WT is connected to actuators A that may be part of the second positioner PW (not shown in FIG. 2). These actuators are connected to a control device CON with a processor CPU and a memory M. The processor CPU further receives information from lateral position sensors LPS (part of the position sensor IF2) measuring the position of the substrate table WT or substrate table holder by electric (capacitive, inductive) or optical, e.g., interferometric (as shown in FIG. 1) devices. The processor also receives input from a level sensor LS which measures the height and/or tilt information from the target area C on the substrate W where the projection beam PB hits the substrate surface. The level sensor LS may be, for example, an optical sensor as described here; alternatively, a pneumatic or capacitive sensor (for example) is conceivable.

The term height as used herein refers to a direction substantially perpendicular to the surface of the substrate W, i.e. substantially perpendicular to the surface of the substrate W that is to be exposed. The level sensor LS measures the vertical position of one or more very small areas generating height data. The level sensor LS may comprise a light source (not shown) for producing a light beam B, projection optics (not shown) for projecting the light beam B onto the substrate W, detection optics (not shown) and a sensor or detector D. The detector D generates a height dependant signal, which is fed to the processor. The processor is arranged to process the height information and to construct a measured height map, which may be stored into memory M.

An example of a procedure for measuring height data in a projection apparatus is described in U.S. Pat. No. 5,191,200. This procedure may be performed during exposure (on-the-fly), by measuring the part of the substrate W that is being exposed or is next to be exposed, but the surface of the substrate W may also be measured in advance. This latter approach may also be done at a remote position, for instance in a separate measuring instrument. In the latter case, the results of the level sensor measurements may be stored in the form of a so-called height map or height profile and used during exposure to position the substrate W with respect to the focal plane of the optical elements.

The measurements of a level sensor D result in a height data, comprising information about the relative heights of specific positions of the substrate W. This may also be referred to as a height map. Based on this height data, a height profile may be computed, for instance by averaging corresponding height data from different parts of the substrate (e.g., height data corresponding to similar relative positions within different target portions C). In case such corresponding height data is not available, the height profile is equal to the height data. Based on height data or a height profile, a leveling profile may be determined, being an indication of an optimal positioning of the substrate W with respect to a projection system PS. Such a leveling profile may be determined by applying a linear fit through (part of) the height data or the height profile, e.g., by performing a least squares fit (three dimensional) through the points that are inside the measured area.

As explained above, accurate leveling may require measuring the shape (z-positions) and topography (x,y-positions) of the substrate, for instance using a level sensor, resulting in a height data of (at least part) of the substrate W, based on which a leveling profile can be determined. Such a leveling profile may represent the optimal position of the substrate W with respect to the projection system PS, taking into account the local shape and height of the substrate W.

The first operation of the method is a measurement operation. The measurement operation involves measuring the lateral positions of each or some of the alignment marks or reference marks (P1, P2) on a substrate W are measured. Alternatively or additionally the measurement operation involves measuring the height positions of the substrate surface. Generally the height positions are measured at measurement points distributed over essentially the entire surface of the substrate. The measurement points may partially or entirely coincide with the alignment marks or reference marks. Generally, however, the measurement points differ from the alignment marks or reference marks, especially when the latter marks are arranged at the grid lines of the substrate.

The measurement operations may be performed in the lithographic projection apparatus, where the position of the reference marks may be measured in any case for substrate W to substrate table WT alignment and leveling measurement, or it can be performed in a separate machine.

During the measurement operation the measuring system measures the relative height positions (z-direction, substantially perpendicular to the surface of the substrate the pattern is to be applied to) and/or the lateral positions (x,y-directions, substantially perpendicular to the z-direction and to each other) of the entity to be measured. The entity may be the substrate itself or a part thereof, such as one or more specific substrate fields of a substrate. The measurements of the positions are performed at a plurality of measurement points, in this example the reference marks on the substrate W.

The above-mentioned measurement operation of the relevant positions of reference marks is repeated for all substrates of a given lot, i.e. substrates that are to be subjected to the same operations in the projection device, if it is intended to characterize the similarity or quality of the substrates in a lot. If, on the other hand, it is intended to characterize the substrates of a given support table, i.e. the substrates that have been processed or will be processed by the same support table (also referred to as the wafer table or chuck) of the projection device, the operation of measuring the positions (x,y,z) at the measurement points is repeated for all substrates assigned to the specific support table.

More generally, a set of substrates is measured, which enables the characterization of the substrates in the substrate set or in a subset thereof. In practice the measurement may often be performed for a lot, so that it is possible the determine the quality of the substrates of the lot (set) or the quality of a subset of the lot, for instance the quality of substrates handled by one of the chucks of the lithographic device.

It is also possible to perform the characterization for the various fields on the same substrate. In this case the operation of measuring the positions at the measuring points is repeated for a plurality of the fields of the substrate.

Although in the above-mentioned measurement operation (relative) positional information of the substrate(s) is measured, the operation may involve measurement of any kind of data relating to the substrate in general and/or to the particular layer of concern, as well as statistical measures. For example, the information may comprise raw position data; raw sensor data indicative of the substrate markers; and/or calculations from the data, such as magnification, translation, rotation or differences of individual measurements with respect to a reference grid described by parameters.

According to the embodiment, positions are in modeled as $$p_{i,j} = f_{i,j}$$

wherein subscripts indicate a dependency of either substrate (i) or measurement point (j) or both, wherein p is the position and wherein f is a function of the process for producing the measured substrate. This use of subscripts will be continued throughout this document.

The measurements for are modeled as $$w_{i,j} = p_{i,j} + \epsilon_{i,j}$$

where:
w is the measured value; and
$\epsilon$ is random process which is identically distributed for the different substrates and which is stationary, i.e. which is stable over the different measurement points (j). The random process may be referred to as measurement noise and for example comprises measurement-device related noise.

The production function $f$ for producing the substrate is modeled to be $$f_{i,j} = h_j + g_{i,j}$$

wherein
h is a selected model function which only depends on the measurement points (j); and
g is a rest term which need not be selected as will be clarified later. Instead of being a selected model function, the function h represents a function comprising convenient parameters which can be controlled for future process steps to be applied to the substrate such as a magnification to use.

The rest term (g) should be seen to model the process as far as not described by the model function (h). In case the production function (f) is wrongly modeled and, in reality, the production function (f) can not be split up into a superposition of a model function (h) (which does not depend on the substrate (i)) and a rest term which depends on both the substrate and the measurement point, the term is only defined by rewriting the above model as $$g_{i,j} = f_{i,j} - h_j$$

In the embodiment a presumption is made. It is presumed that the process was identical for all substrates, so that the rest term (g) does not depend on the substrate as well, so that gi,j is further expressed as gj.

It will be clear to the skilled person that the model for the measurements now no longer allows for a deterministic component which depends on the substrate as both the model function (h) and the rest term (g) do not depend on the substrate (i) and the measurements are now modeled as $$w_{i,j} = h_j + g_j + \epsilon_{i,j}$$

This will be counter intuitive to the skilled person, as the method is used to detect inconsistencies between the substrates (i).

Then parameters of the selected model function (h) are estimated by fitting the function to the measurements for instance by applying the least squares criterium as this is a maximum likelihood estimator. Other criteria may be used as will be clear to the skilled person. Parameters of the rest term (g) are not fitted, as no known function to describe the rest term (g) is known and therefore also no parameters of such a function are known. This corresponds to neglecting the rest term (g) while fitting the model function (h). Thus in the fit the measurements are described as $$w_{i,j} = h_{j,\beta} + Z_{i,j}$$

wherein $$Z_{i,j} = g_j + \epsilon_{i,j}.$$

and wherein $\beta$ stands for a parameter set of model function (h). The parameter set ($\beta$) is modeled to be constant throughout the plurality of substrates (i) and the measurement points (j).

Thus $Z_{i,j}$ is a residue comprising a deterministic component which depends on the measurement point (j) as well as a random, stabile process $\epsilon$ which depends on the substrate and the measurement point and which is superposed on the deterministic component.

It will be clear to the skilled person that, although the rest term (g) was neglected, the expectation of the residual $Z_{i,j}$ is the expectation of the random, stabile process, superposed on the deterministic component which depends on the measurement point (j).

In the embodiment, then, for the first entity (i.e. substrate in this embodiment), the substrate average residue is estimated by the expression $$\bar{Z}_i = \frac{1}{n} \sum_{j=1}^{n} Z_{i,j}$$

wherein the same notation is used as in the earlier parts of this document and wherein n indicates the number of measurement points. The bar over the symbol for the residue indicates that it concerns an average.

It is expected that for the second entity (i.e. substrate in this embodiment), the average value of the residues is equal to the corresponding average value for the first entity. This is because it was presumed that the entities were produced and measured in an identical way so that the rest term (g) does not depend on the entity (i). Therefore it is expected that for the second entity, the average value of the earlier neglected rest term (g) is equal to the corresponding average value for the first entity.

Furthermore to see that the average values are expected to be equal, the expression for the average values is rewritten according to the expression $$\bar{Z}_i = \frac{1}{n} \sum_{j=1}^{n} Z_{i,j} = \frac{1}{n} \sum_{j=1}^{n} (g_j + \varepsilon_{i,j}) = \frac{1}{n} \sum_{j=1}^{n} g_j + \frac{1}{n} \sum_{j=1}^{n} \varepsilon_{i,j}$$

Also it is realized that $\epsilon_{i,j}$ is a stationary identically distributed process so that with a larger number of measurement points (n) the expectations of the sums for different entities (i) and measurement points (j) are equal for the first and second substrate. The average value of residues is estimated for the second entity as well.

In a next step of the embodiment the correlation coefficient between a first substrate (i'=1) and a second substrate (i"=2) is estimated according to the expression $$r_{1,2} = \frac{\sum_{j=1}^{n}[(Z_{1,j} - \overline{Z}_1)(Z_{2,j} - \overline{Z}_2)]}{\sqrt{\sum_{j=1}^{n}(Z_{1,j} - \overline{Z}_1)^2 \sum_{j=1}^{n}(Z_{2,j} - \overline{Z}_2)^2}}$$

wherein r1,2 is the estimator for the correlation coefficient.

Note that, as modeled, the expectation of the deterministic part of the residue ($Z_{i,j}$) depends on the measurement point (j) and not on the substrate (i) because it was presumed that the process was identical for all substrates (i). In the estimator for the correlation coefficient ($r_{1,2}$) however, the average of the residue for a substrate is estimated per substrate and not per measurement point.

The skilled man will appreciate that the expectation for the stochastic component is zero for all terms within ( ) in the formula for the estimator for the correlation coefficient.

Thus the expectation of the residue ($Z_{i,j}$) is expected to differ from the estimated substrate average of the residue, so that the expectation of the numerator of the estimator for the correlation coefficient ($r_{i,i'}$) comprises a deterministic component. For example, $g_1=1$ and $g_2=2$ so that the numerator of the estimator for the correlation coefficient is expected to be $2*(1-1.5)(2-1.5)=-0.5$.

This approach is advantageous however if the variations in the deterministic component between the entities is relatively large or said otherwise when the differences of the values of the rest term $(g)_j$ are relatively large both with respect to the stochastic component ($\epsilon$) in the residue (Z), or again said otherwise when the model was relatively poor.

The result is that with a poor model but a valid presumption (i.e. that the process was constant), the estimated correlation coefficient will be high because the deterministic part of the numerator is much larger than the stochastic part of the numerator and because those deterministic parts are equal for entity i' and i".

In case the process changed between the first substrate (i') and the second substrate (i"), the fitted model will fit less good to the measurements ($w_{i,j}$) and the deterministic parts of ($Z_{i'}$) and ($Z_{i''}$) will differ. Thus the deterministic part of the estimated correlation coefficient will be low. In that case the stochastic part of the estimated correlation coefficient will become more important. It can be imagined that for highly uncorrelated noise, the estimated correlation coefficient may still however be dominated by the deterministic part.

If the correlation between the stochastic parts, i.e. between the realizations of the random process ($\epsilon_{i,j}$) is low, the stochastic part of the estimated correlation between the residues will be low. The lower the correlation between the stochastic parts, the higher the sensitivity for the validity of the presumption. Also, the larger the misfit, the larger the deterministic part of the residue and the higher the correlation in case there is a valid presumption. Said differently, by reducing the number of estimated parameters when fitting the model function (h), i.e. by reducing the quality of the model, the better the estimator for the correlation coefficient can be used to characterize the substrates (or the measurements on the substrates).

This is advantageous, as the lower the number of estimated parameters, the easier it is to monitor them and to assess them. It will also be clear to the person skilled in the art, that the model function (h) may represent a model convenient to the application having parameters which may be varied during further processing steps of the substrates but having nothing to do with the earlier production process of the substrate or the measurement process as the method works better if the effects of mis-modeling become more dominant relative to the noise levels.

In case the correlation coefficient is to low, for instance below 0.95 or 0.9 or 0.85 for all substrates, the model may be adjusted by fitting even less parameters in order to increase the deterministic component of the residue.

The influence on the estimated correlation coefficient is used to verify if the presumption that the process was identical for all substrates was correct, which will be further clarified below.

Without this further clarification, it already will be clear to the person skilled in the art, that in an analogue way errors such as a particle present between the second substrate and a substrate table used to support the substrate and deforming the second substrate but not present between the first substrate and the substrate table also has an influence in the estimated correlation coefficient. Similarly the presumption may be found to be incorrect if both substrates are or have been supported by different substrate tables both present in the lithographic apparatus. In an again similar fashion, the presumption may be found to be incorrect because of layer-to-layer interaction differences between the substrates.

In the embodiment, the measurements ($w_{i,j}$) are measurements of the difference between measured position data and the corresponding expected position data. Thus each measurement corresponds to a position measurement of a feature of substrate of the plurality of substrates. The measurements ($w_{i,j}$) are modeled as $$w_{i,j} = \beta_0 + \beta_1 x_j + \beta_2 y_j + Z_{i,j}$$

wherein $\beta_0$, $\beta_1 x_j$, $\beta_2 y_j$ are members of the parameter set ($\beta$) of model function (h) and are linear coefficients. This embodiment corresponds to a situation wherein the measured position data is composed of fine wafer align (FIWA) data (i.e., representative of the lateral positions) taken at various measurement points across the substrate and z-map data (representative of the height positions), which comprises one average height position per substrate field, ie., the average of all measured heights available in the respective substrate field.

In case the correlation coefficients are found to be too low, the sensitivity of the correlation coefficient may be raised by discarding of one model term, such as $\beta_1 x_j$ and refitting the model function (h). This will raise the sensitivity of the correlation coefficient as the deterministic part of the residues is expected to increase.

In another embodiment the measured position data is composed of z-map data (representative of the height positions) taken at several measurement points per substrate field and another regression model may be used:

$$w_{i,j} = \beta_0 + \beta_1 x + \beta_2 y + \beta_3 x^2 + \beta_4 y^2 + \beta_5 xy + Z_{i,j}$$

wherein similar symbols are used for similar model terms and thus $\beta_0$, $\beta_1$, $\beta_2$, $\beta_3$, $\beta_4$, $\beta_5$ are members of the parameter set ($\beta$) of model function (h) and are linear coefficients.

More generally the method as described in this document is applied to a plurality of entities such as all substrates in a batch or a lot and for instance each entity corresponding to several position measurements.

Once the correlation coefficient ($r_{1,2}$) between the residues has been estimated, the estimated correlation coefficient is compared to a threshold amount to determine if the presumption that the process was identical for all substrates was correct. If the presumption is not correct, there is a dissimilarity between the entities. In case of more than two sets of residues, two or more correlation coefficients may be estimated and compared to the threshold amount in order to determine the extent a data set is similar to each of the other data sets.

In a further embodiment of the invention, for each entity of the plurality of entities the correlation coefficients with respect to every other entity of the plurality of entities is estimated. Averaging these correlation coefficients for the entity set gives a measure for the validity of the presumption that the process was identical for all entities within the plurality of entities. An example of an expression for the estimation of the average correlation coefficient for the plurality of entities entity set is given by:

with $\bar{r}_r$ the average correlation coefficient. The estimated average correlation coefficient of the entity set is compared to a threshold amount. If the estimated correlation coefficient is larger than the threshold value, it is determined that the presumption was valid and that the various entities in the entity set have a large consistency, whereas it is determined that the presumption was not valid and that the entities lack sufficient consistency when the average correlation coefficient remains lower than the threshold value. In the latter case the entities are rejected. Alternatively more analyses may be performed for instance to assess if the entities are sufficiently similar.

As mentioned earlier, in case the entities are substrates to be processed by the projection device and the entity set comprises substrates from a lot that are to be subjected to the same operations in the projection device, the above procedure provides a measure for the lot consistency. The lot consistency may be lowered by the use of different support tables. In case the entities are substrates to be processed by a projection device and the entity set comprises substrates to be carried by the same support table of the projection device, the procedure provides a measure for the support table consistency (also referred to as wafer table consistency or the chuck consistency). In case the entities are fields of a substrate to be processed by a projection device and the entity set comprises the fields of the at least one substrate, the procedure provides for a measure of the field consistency of the specific substrate. The entities may also be formed by different layers of a substrate. In this case the procedure provides a measure for inter-layer consistency.

In a further embodiment an average correlation coefficient per entity is estimated. For instance, if the plurality of entities comprises of a plurality of substrates of the same product lot (typically 25 wafers), then for each substrate (wafer) the correlation coefficient with respect to each of the other substrates (wafers) of the lot is estimated. The estimator for the average correlation coefficient $\bar{r}_i$ of wafer (i) is given by:

$$\bar{r}_i = \frac{1}{(m-1)} \sum_{j=1, j \neq i}^{m} r_{i,j}$$

wherein the indices follow the notation used throughout this document. The estimated average correlation coefficients of the respective entities are then compared with one or more threshold values. When the values of one or more of the estimated correlation coefficients are lower than the threshold value, it is determined that the presumption is not valid and that the plurality of entities lacks consistency.

In another embodiment the comparison with one or more threshold values is replaced by a comparison with each other. In this case, after having performed the above calculations, the average correlation coefficients $\bar{r}_i$ are compared with each other in order to determine the extent of consistency within the plurality of entities. For instance, visualizing the estimated average correlation coefficients for all entities in the entity set, in this example plotting the estimated average correlation coefficients of each wafer in the lot, in a graphical representation makes it easier for an operator to visually pinpoint an entity or group of entities (for instance a wafer or group of wafers having a deviating wafer grid (x,y), field shape (z) and/or wafer shape (z)) responsible for bad lot consistency. Also in this case an additional comparison with a threshold value may be performed. The deviations of the respective estimated average correlation coefficients per entity from a threshold value, which is preferably derived from the overall mean value of the averaged correlation coefficients per entity, may be used as indication of the validity of the presumption and the consistency in the plurality of entities.

In an embodiment of the invention, the measurements are modeled to as $$w_{i,j} = p'_{i,j} + \epsilon_{i,j}$$

wherein p' models both the positions (p) of features on the entities as well as influence of the measurement device such as drift. Again the model comprises a stabile random process $\epsilon$. The remainder of the method of the invention is applied in a similar way. In the embodiment, the estimate for the correlation coefficient is used to verify if the measurement process has changed. For instance the measurements may have drifted because of an instability of the measurement device or the entities may have been substrates that were supported on a substrate table and for some substrates there was contamination present between the substrate and the substrate table. Alternatively, some substrates were supported on a first substrate table during the measurements and the remainder of the substrates in the plurality of substrate was supported on a second substrate table supporting the substrates in a different way during the measurements.

In a further embodiment, the parameter set ($\beta$) of the model function (h) is modelled to depend on the entity. Thus each substrate comprising different measurement points, will be fitted with it's own parameters ($\beta_i$). Still the rest term ($g_j$), i.e. the deterministic part of the residue (Z) is modelled to be same for the entities. This corresponds to expecting a constant fingerprint for the different entities. In the fingerprint, the rest term ($g_j$) is modelled to differ from zero in at least one measurement point (and the same for all entities). Typically for all measurement points, the rest term $(g)_j$ has a different value. The further process steps are analogue to what has been explained earlier. Again the fitted model is subtracted from the measurements giving the residues which are used to estimate the correlation coefficient. In this embodiment as well, the expectation of the deterministic part of the residue (Z) typically differs between different measurement points (j).

As in the earlier embodiments, in the estimator for the correlation coefficient, the average of the residue for a substrate is estimated per substrate and not per measurement point. Again, as in the earlier embodiment, the expectation for the stochastic component is zero for all terms within ( ) in the formula for the estimator for the correlation coefficient. Therefore again the estimated correlation coefficient will be dominated by the deterministic part of the residue and the estimated correlation coefficient can be used to characterize the similarity between the measurements.

Figure 3A:
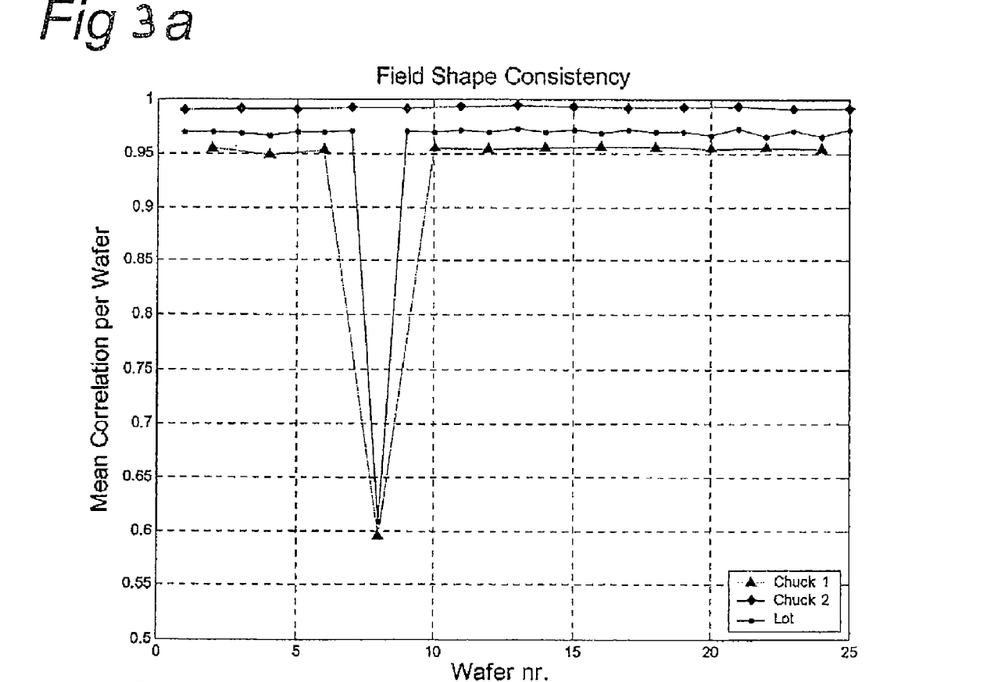
FIG. 3A is an example of a graphical representation of the mean correlation as a function of the wafer number for the lot, the first support table and the second support table.

In the following two examples are given of the characterization of the consistency between a plurality of entities, in this case a plurality of wafers in a lot of 25 wafers. A first part of the wafers of the lot is measured while being seated on a first support table (chuck), while the remaining wafers are measured when they are seated in the second support table of a lithographic device as described herein. FIG. 3A shows a graphical representation of the estimated average correlation coefficient $r_i$ (with i=1-25) (vertical axis) as a function of the wafer number (i) (horizontal axis). A first set of wafers is handled by a first support table (chuck 1). This first set is indicated by diamond shaped labels. A second set of wafers is handled by a second support table (chuck 2). The second set is indicated by a triangular shaped label. Clearly the wafers handled by the second support table (chuck 2; diamonds), i.e. wafers 1, 3, 5, 7, . . . , 25 show a good correlation, with estimated average correlation coefficients of more than 0.95. However, the estimated average correlation coefficients of the wafers handled by the first support table (chuck 1; triangles), i.e. wafers 2, 4, 6, . . . , 24) show a dip at a defective wafer 8. The estimated average correlation coefficient drops from a value of about 0.95 to about 0.6. The same effect is present in the curve associated with the estimated average correlation coefficients of all wafers (i.e. the wafers of the lot) which is here indicated by dots (lot). When for instance the threshold value is chosen at the level of 0.90, then from the measurement results it can be easily derived that only wafer 8 cannot be considered consistent with the rest of the wafers.

The estimation of the correlation coefficients and the comparison of the correlation coefficients with a threshold value is as such sufficient to characterize the consistency of the set. However, from this information alone it is difficult and sometimes even impossible to determine the cause of any lack of consistency.

Figure 3B:
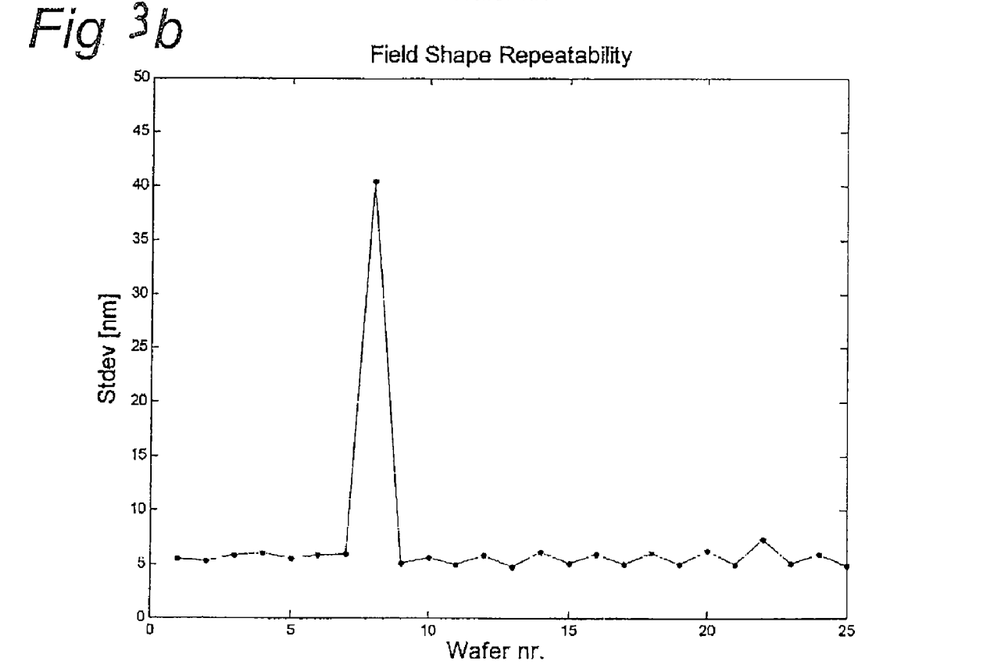
FIG. 3B is a graphical representation of the standard deviation (σ) as function of the wafer number of the example shown in FIG. 3A.

In an embodiment the standard deviation (field repeatability) is estimated as well, to help determining the cause of the inconsistency of wafer 8. In the example the defect of the defective wafer 8 is caused by a large focus spot as a result of the presence of a small particle between the wafer and the support table. The small particle causes an artifact in one field of the wafer only. FIG. 3B shows the estimated standard deviation of the measured position data per wafer. The artifact is directly reflected in the rise of the estimated standard deviation of the defective wafer 8, as is shown in FIG. 3B. FIG. 3B shows the standard deviation in nanometer (vertical axis) plotted against the wafer number (horizontal axis).

The standard deviation is estimated as $$\hat{\sigma}^2 = \frac{1}{n-k-1} \sum_{i=1}^{n} \left( \frac{1}{m-1} \sum_{j=1}^{m} \left( Z_{i,j} - \frac{1}{m} \sum_{k=1}^{m} Z_{i,k} \right)^2 \right)$$

Figure 4A:
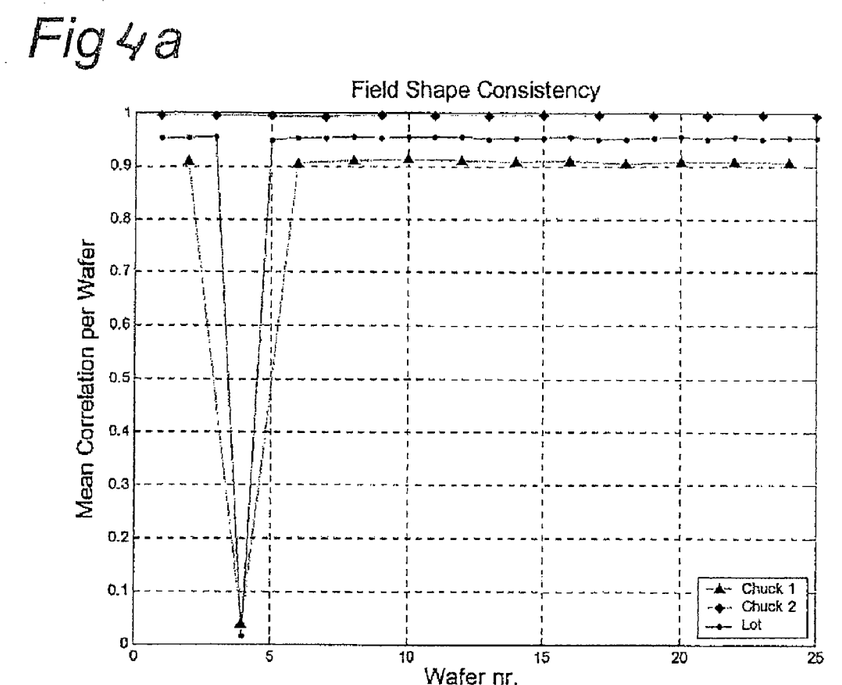
FIG. 4A is an example of a graphical representation of the mean correlation as a function of the wafer number for the lot, the first support table and the second support table.
Figure 4B:
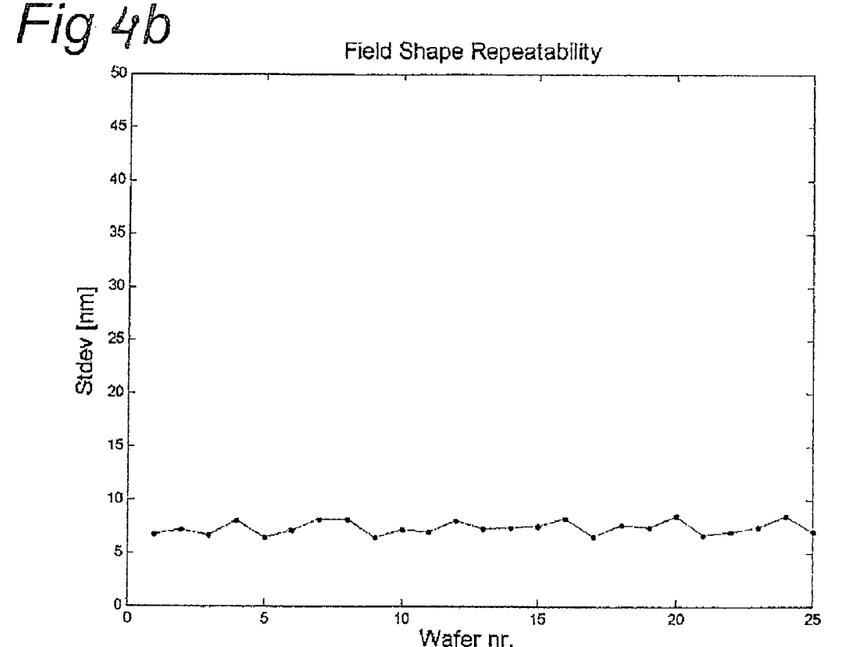
FIG. 4B is a graphical representation of the standard deviation (σ) as function of the wafer number.

In FIGS. 4A and 4B similar graphical representations of the estimated average correlation coefficient per wafer and the estimated standard deviation per wafer for another example are given. In FIG. 4A the estimated average correlation coefficient (vertical axis) is plotted against the wafer number (horizontal axis). Again the wafers handled by the second substrate table (chuck 2; diamonds) show a good correlation with values of the estimated average correlation coefficients of more than 0.99. However, the estimated average correlation coefficients for the wafers of the first chuck (triangles), and of course of the lot (dots), show a dip at the fourth wafer. The estimated average correlation coefficient of the fourth wafer is clearly below the threshold value of 0.90 and hence the fourth wafer 4 is not consistent with the other wafers of the lot. However, the curve of the estimated standard deviations shown in FIG. 4B, which shows the standard deviation (vertical axis) plotted against the wafer number (horizontal axis), remains more or less flat, indicating that the inconsistency of the fourth wafer may have been caused by another phenomenon than the phenomenon that caused the defect in the example of FIGS. 3A and 3B.

In the present example the wafer defect was caused by a defective layer structure (layer-stack). Since the defect was not restricted to a small area but instead was present over at least a large part of the wafer surface, the estimated standard deviation of the measured position data of the fourth wafer proved to be in the same order of magnitude as the estimated standard deviations belonging to the other wafers of the lot. Therefore in this example the estimated standard devision of the position data (FIG. 4B) does not have a similar rise as was the case in the first example (FIG. 3b).

In a further embodiment, the measurements are modeled to comprise a stabile random process and a deterministic process. The deterministic process is expanded in a Tailor expansion having derivatives to the measurement points (position co-ordinates) and entities for which a mathematical formula need not be known. The derivatives to the measurement points (position co-ordinates) comprise derivatives to two out of three orthogonal directions. Alternatively, the derivatives comprise derivatives to all three orthogonal directions. A presumption is made in that the entities were produced and measured in an identical way (setting derivative-terms to the entity (i) to zero). Then a limited number of linear coefficients related to the measurement point (j) as variable is estimated by fitting the Tailor-expansion terms corresponding to the linear coefficients to the measurements ($w_{i,j}$). More specifically, a Tailor-expansion with position co-ordinates as variables made. This corresponds to neglecting Tailor-expansion terms related to the measurement point (j) as far as the corresponding linear coefficient is not included in the limited number of linear coefficients when estimating the linear coefficients for the limited number of linear coefficients.

Limiting the number of linear coefficients is advantageous, since less parameters to characterize possibly fast amounts of data are easier to monitor, to store and to handle than larger amounts of data.

The limited number of linear coefficients is estimated with a maximum likelihood estimator such as an estimator resulting from the least squares criterion. Then the residuals ($Z_{i,j}$) (which include the neglected, non-fitted Tailor-expansion terms related to the measurement point (j), in other words the position variable, and the stabile random process $\epsilon_{i,j}$) are determined for a first entity and a second entity in the plurality of entities.

Then, for the first entity, the average value of the residues related to the first and second entities is estimated by the expression $$\bar{Z}_i = \frac{1}{n} \sum_{j=1}^{n} Z_{i,j}$$

wherein the same notation is used as in the earlier parts of this document.

As it was presumed that the entities were produced and measured in an identical way, the derivate-terms to the entity (i) were set to zero. Therefore it is expected that for the second entity, the average value of the earlier neglected Tailor-expansion terms related to the measurement point (j) is equal to the corresponding average value for the first entity. Also, the expected values of the random variables are equal for both entities. Anyhow, the average value of the residues is estimated for the second entity as well.

The residuals and both estimated average values for the first and second entities are used to estimate a correlation coefficient (r1,2) between the first entity and the second entity according to $$r_{1,2} = \frac{\sum_{j=1}^{n}[(Z_{1,j}-\bar{Z}_1)(Z_{2,j}-\bar{Z}_2)]}{\sqrt{\sum_{j=1}^{n}(Z_{1,j}-\bar{Z}_1)^2 \sum_{j=1}^{n}(Z_{2,j}-\bar{Z}_2)^2}}$$

wherein again the same notation is used as earlier in this document.

The estimated correlation coefficient is used to determine the similarity between the measurements of the entities. The similarity may either be found to be satisfactorily or unsatisfactorily for instance because of process changes during the production of the entities or changes to the measurement process.

It will be clear to the person skilled in the art, that the amount of calculation may be reduced by computing the residues only for a number of entities for instance the first and the second entity in a larger number of entities. Additionally or alternatively, the residues for the first and second entity may be computed for only a part of the measurement points.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. Method for characterizing the similarity between measurements on a plurality of entities (i) comprising a first entity (i') and a second entity (i"), comprising:

taking measurements ($w_{i,j}$) at a plurality of measurement points (j) per entity (i) with a sensor;

defining a model comprising a stochastic process and a model function (h), the model function (h) having values which depend on a set of parameters ($\beta$) and the measurement points (j);

estimating the set of parameters ($\beta$) by fitting the model function to the measurements ($w_{i,j}$);

determining residual data ($Z_{i,j}$) at the plurality of measurement points (j) for the first entity (i') and the second entity (i") by subtracting the fitted model function from the measurements;

estimating a correlation coefficient ($r_{i',i''}$) for the first entity (i') and the second entity (i") based on the determined residual data ($Z_{i,j}$);

using the estimated correlation coefficient ($r_{i',i''}$) to characterize the similarity between the measurements; and defining the model such that the residual data is expected to have a deterministic component which depends on the measurement points and that dominates the estimate of the correlation coefficient and estimating the correlation coefficient ($r_{i',i''}$) using an estimate for the entity average residue averaged over the measurement points of the first entity (i') and using an estimate for the entity average residue averaged over the measurement points of the second entity (i").

2. Method of claim 1, wherein the set of parameters ($\beta$) comprises parameters which depend on the entities.

3. Method of any of the preceding claims, wherein the entities are substrates, substrate layers or substrate fields.

4. Method of any of claims 1 or 2, wherein the measurements correspond to position measurements of features of an entity of the plurality of entities.

5. Method of any of claims 1 or 2, comprising comparing the estimated correlation coefficient to a threshold amount to determine the extent of similarity between the entities.

6. Method of any of claims 1 or 2, comprising estimating at least one further correlation coefficient between the first entity (i') and a third entity (i''') based on the residual data ($Z_{i,j}$);
estimating an average set correlation coefficient based on the estimated correlation coefficient and the estimated further correlation coefficient; and
using the estimated average correlation coefficient to characterize the similarity.

7. Method of any of the claims 1 or 2, comprising;
estimating the correlation coefficients between the first entity (i) and each other entity in the plurality of entities;
estimating an average entity correlation coefficient for the first entity (i);
estimating the correlations coefficients between a further entity (i'''') and each other entity in the plurality of entities;
estimating a further average entity correlation coefficient for the further entity (i''''); and
comparing the estimated average entity correlation coefficient and the estimated further average entity correlation coefficient to characterize the similarity.

8. A computer program product comprising instructions and data stored on a non-transitory computer readable medium to allow a processor to run a predetermined program in accordance with any one of the methods as claimed in claim 1 or 2.

9. Data carrier comprising a computer program product according to claim 8.

10. A method for characterizing the similarity between measurements of a plurality of entities (i) comprising a first entity (i') and a second entity (i''), comprising:
taking measurements ($w_{i,j}$) at a plurality of measurement points (j) per entity (i) using a sensor;
defining a model, the model comprising a stochastic process and a model function (h), the model function (h) having values which depend on a set of parameters (β) and the measurement points (j);
estimating the set of parameters (β) by fitting the model function to the measurements ($w_{i,j}$);
determining residual data ($Z_{i,j}$) at the plurality of measurement points (j) for the first entity (i') and the second entity (i'') by subtracting the fitted model function from the measurements;
estimating a correlation coefficient ($r_{i',i''}$) for the first entity (i') and the second entity (i'') based on the determined residual data ($Z_{i,j}$); and
using the estimated correlation coefficient ($r_{i',i''}$) to characterize the similarity between the measurements;
wherein the model is defined such that the residual data is expected to have a deterministic component which depends on the measurement points and that dominates the estimate of the correlation coefficient and estimating the correlation coefficient ($r_{i',i''}$) using an estimate for the entity average residue averaged over the measurement points of the first entity (i') and using an estimate for the entity average residue averaged over the measurement points of the second entity (i'').

11. A method according to claim 10, wherein the set of parameters (β) comprises parameters which depend on the entities.

12. A method according to claim 10, wherein the entities are substrates, substrate layers or substrate fields.

13. A method according to claim 10, wherein the measurements correspond to position measurements of features of an entity of the plurality of entities.

14. A method according to claim 10, further comprising:
comparing the estimated correlation coefficient to a threshold amount to determine the extent of similarity between the entities.

15. A method according to claim 10, further comprising:
estimating at least one further correlation coefficient between the first entity (i') and a third entity (i''') based on the residual data ($Z_{i,j}$);
estimating an average set correlation coefficient based on the estimated correlation coefficient and the estimated further correlation coefficient; and
using the estimated average correlation coefficient to characterize the similarity.

16. A method according to claim 10, further comprising:
estimating the correlation coefficients between the first entity (i) and each other entity in the plurality of entities;
estimating an average entity correlation coefficient for the first entity (i);
estimating the correlations coefficients between a further entity (i'''') and each other entity in the plurality of entities;
estimating a further average entity correlation coefficient for the further entity (i'''');
comparing the estimated average entity correlation coefficient and the estimated further average entity correlation coefficient to characterize the similarity.

17. A computer program product comprising instructions and data stored on a non-transitory computer readable medium and which when executed by a computer processor, causes the computer to characterize the similarity between measurements of a plurality of entities (i) comprising a first entity (i') and a second entity (i''), by a process comprising:
receiving measurements ($w_{i,j}$) taken at a plurality of measurement points (j) per entity (i);
defining a model comprising a stochastic process and a model function (h), the model function (h) having values which depend on a set of parameters (β) and the measurement points (j);
estimating the set of parameters (β) by fitting the model function to the measurements ($w_{i,j}$);
determining residual data ($Z_{i,j}$) at the plurality of measurement points (j) for the first entity (i') and the second entity (i'') by subtracting the fitted model function from the measurements;
estimating a correlation coefficient ($r_{i',i''}$) for the first entity (i') and the second entity (i'') based on the determined residual data ($Z_{i,j}$);
using the estimated correlation coefficient ($r_{i',i''}$) to characterize the similarity between the measurements;
wherein the model is defined such that the residual data is expected to have a deterministic component which depends on the measurement points and that dominates the estimate of the correlation coefficient and estimating the correlation coefficient ($r_{i',i''}$) using an estimate for the entity average residue averaged over the measurement points of the first entity (i') and using an estimate for the entity average residue averaged over the measurement points of the second entity (i'').

18. A computer program product according to claim 17, wherein the set of parameters (β) comprises parameters which depend on the entities.

19. A computer program product according to claim 17, wherein the entities are substrates, substrate layers or substrate fields.

20. A computer program product according to claim 17, wherein the measurements correspond to position measurements of features of an entity of the plurality of entities.

21. A computer program product according to claim 17, further comprising program code for:
    comparing the estimated correlation coefficient to a threshold amount to determine the extent of similarity between the entities.

22. A computer program product according to claim 17, further comprising program code for:
    estimating at least one further correlation coefficient between the first entity (i') and a third entity (i''') based on the residual data ($Z_{i,j}$);
    estimating an average set correlation coefficient based on the estimated correlation coefficient and the estimated further correlation coefficient; and
    using the estimated average correlation coefficient to characterize the similarity.

23. A computer program product according to claim 17, further comprising program code for:
    estimating the correlation coefficients between the first entity (i) and each other entity in the plurality of entities;
    estimating an average entity correlation coefficient for the first entity (i);
    estimating the correlations coefficients between a further entity (i'''') and each other entity in the plurality of entities;
    estimating a further average entity correlation coefficient for the further entity (i''''); and
    comparing the estimated average entity correlation coefficient and the estimated further average entity correlation coefficient to characterize the similarity.

* * * * *